(12) United States Patent
Takeuchi

(10) Patent No.: US 7,955,065 B2
(45) Date of Patent: Jun. 7, 2011

(54) RESIN FILLING APPARATUS, FILLING METHOD, AND METHOD OF MANUFACTURING AN ELECTRONIC DEVICE

(75) Inventor: Shuichi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 597 days.

(21) Appl. No.: 12/020,013

(22) Filed: Jan. 25, 2008

(65) Prior Publication Data

US 2008/0216917 A1    Sep. 11, 2008

(30) Foreign Application Priority Data

Mar. 5, 2007    (JP) ................................. 2007-054074

(51) Int. Cl.
*H01L 21/56* (2006.01)
(52) U.S. Cl. ....................................... 425/110
(58) Field of Classification Search .................... 425/110
See application file for complete search history.

(56) References Cited

U.S. PATENT DOCUMENTS

| | | | | | |
|---|---|---|---|---|---|
| 2,769,202 | A | * | 11/1956 | Thompson | 425/406 |
| 2,794,756 | A | * | 6/1957 | Leverenz | 428/71 |
| 3,137,750 | A | * | 6/1964 | Gringras | 264/257 |
| 3,309,450 | A | * | 3/1967 | Rodgers | 264/257 |
| 5,364,584 | A | * | 11/1994 | Imanara et al. | 264/510 |
| 2002/0115237 | A1 | * | 8/2002 | Williams | 438/127 |
| 2002/0185748 | A1 | * | 12/2002 | Akram et al. | 257/778 |
| 2005/0253281 | A1 | * | 11/2005 | Odegard et al. | 257/783 |

FOREIGN PATENT DOCUMENTS

| | | | |
|---|---|---|---|
| JP | 08306717 | A * | 11/1996 |
| JP | 9232347 | A | 9/1997 |
| JP | 2005193262 | A * | 7/2005 |

* cited by examiner

*Primary Examiner* — Robert B Davis
(74) *Attorney, Agent, or Firm* — Westerman, Hattori, Daniels & Adrian, LLP

(57) ABSTRACT

A resin filling apparatus, a filling method, and a method of manufacturing an electronic device fill a cavity between a substrate and an electronic component mounted on the substrate with resin. The resin filling apparatus includes a stage for supporting the substrate in an inclined state, and an application head for filling the cavity with resin from a lower side of the inclined substrate.

4 Claims, 4 Drawing Sheets

RESIN FILLING APPARATUS, FILLING METHOD, AND METHOD OF MANUFACTURING AN ELECTRONIC DEVICE

BACKGROUND OF THE INVENTION

1. Field of the Invention

The present invention relates to a resin filling apparatus that fills resin into a cavity between a substrate and an electronic component mounted on the substrate, to a filling method, and a method of manufacturing an electronic device where a cavity between a substrate and an electronic component mounted on the substrate is filled with resin.

2. Related Art

One example of an electronic device where a cavity between a substrate and an electronic component mounted on the substrate is filled with resin is an electronic device where a semiconductor chip is flip-chip bonded on a mounting substrate.

As shown in FIG. 5, in a conventional method of filling a cavity of this type of electronic device with resin, resin 105 is supplied from a needle 112 to the periphery of a cavity 104 between a substrate 102 and an electronic component 103 while heating the substrate 102 on a hot plate 111 so that the cavity 104 is filled by so-called capillary action.

As a method of reducing the time taken to fill the cavity with resin, a resin filling method that will now be described with reference to FIG. 6 has also been invented (see Patent Document 1). According to this method, in a state where a substrate 203 is inclined at a predetermined angle α to the horizontal and an IC chip 202 is disposed so that the upper edge and lower edge are positioned substantially perpendicularly to the inclined direction of the substrate 203, a dispenser nozzle 201 is relatively moved along the upper edge of the IC chip 202 while extruding a sealant 206 in the form of a tacky liquid from a nozzle opening along the top edge into a cavity between the IC chip 202 and the substrate 203.

Patent Document 1

Japanese Laid-Open Patent Publication No. H09-232347

SUMMARY OF THE INVENTION

Conventionally, in an electronic device where the cavity is filled with resin, there has been a problem in that when gaps that have not been filled with resin are present, there is a drop in adhesion, which affects reliability. For example, when voids (i.e., bubbles entrained in the resin during filling) are present between the bumps and wires, there are problems such as short circuits occurring between adjacent wires due to migration. Since the layout pitch of wires has become increasingly fine in recent years, it has become more important to deal with voids between the wires.

The present invention was conceived in view of the problem described above and it is an object of the present invention to provide a resin filling apparatus, a filling method, and a method of manufacturing an electronic device which, when manufacturing an electronic device by filling a cavity between a mounting substrate and an electronic component with resin, can reduce the entrainment of voids during the filling with resin and make it easier for voids entrained in the resin during filling to escape upward. By doing so, there is a further object of manufacturing electronic devices with a significant reduction in entrained voids, reducing the proportion of defective electronic devices, and maintaining high quality.

To achieve the stated object, a resin filling apparatus according to the present invention fills a cavity between a substrate and an electronic component mounted on the substrate with resin, the resin filling apparatus including: a stage for supporting the substrate in an inclined state; and an application head for filling the cavity with resin from a lower side of the inclined substrate.

With this construction, it is possible to fill the cavity between the substrate and the electronic component with resin from the lower side toward the upper side with the substrate supported in an inclined state. By doing so, it is possible for air bubbles ("voids") entrained in the resin during filling to escape up the incline. Also, compared to when filling is carried out with the stage disposed flat, it is possible to reduce the filling rate of the resin and thereby reduce the entrainment of voids.

The resin filling apparatus may further include a flow stopping mechanism for preventing resin that has been supplied onto the substrate from the application head from flowing down the inclined substrate.

With this construction, since a flow stopping mechanism is provided at a lower end of the substrate, it is possible to prevent the resin supplied onto the substrate from flowing down the incline, and to keep the resin in the vicinity of the lower edge of the electronic component. As a result, it is possible to uninterruptedly fill the cavity with resin and to prevent resin from adhering to unnecessary parts of the electronic device and the filling apparatus.

The resin filling apparatus may further include an angle adjusting mechanism capable of arbitrarily adjusting an angle of inclination at which the substrate is held on the stage.

With this construction, it is possible to set an optimal angle in accordance with the material of the resin. On the other hand, by controlling the angle, it is possible to control the filling rate of the resin.

The resin filling apparatus may further include a vibrating mechanism that vibrates the stage.

With the above construction, it is possible to apply vibration to the substrate while resin is being filled, and as a result, it is possible to fill the cavity with resin with no gaps and to make it easier for voids entrained in the resin to escape from the resin.

A method of manufacturing an electronic device according to the present invention manufactures an electronic device where a cavity between a substrate and an electronic component mounted on the substrate is filled with resin, the method of manufacturing including steps of: supporting the substrate in an inclined state; and filling the cavity with resin from a lower side of the inclined substrate.

According to this method, it is possible to fill the cavity of an electronic device with resin from the lower side on an incline toward the upper side. By doing so, it is easier for voids entrained in the resin during filling to escape toward the top of the inclined electronic device held in the inclined state. Also, compared to when filling is carried out with the electronic device disposed flat, since gravity will act down the incline on the resin being filled, it is possible to reduce the filling rate of the resin and thereby reduce the entrainment of voids.

During the step of filling, an angle of inclination of the substrate may be changed.

According to this method, it is possible to change the angle of inclination of the electronic device held in the inclined state while the cavity of the electronic device is being filled with resin. By doing so, it is possible to carry out optimal control over the filling in accordance with the material of the resin and the filling conditions.

A resin filling method according to the present invention fills a cavity between a substrate and an electronic component mounted on the substrate with resin, the resin filling method including steps of: inclining the substrate; and filling the cavity with resin from a lower side of the inclined substrate.

According to this method, it is possible to provide a resin filling method where it is easy for voids entrained in resin during filling to escape up an incline and where it is possible to reduce the entrainment of voids by reducing the filling rate of resin.

DESCRIPTION OF THE PREFERRED EMBODIMENTS

Figure 1:
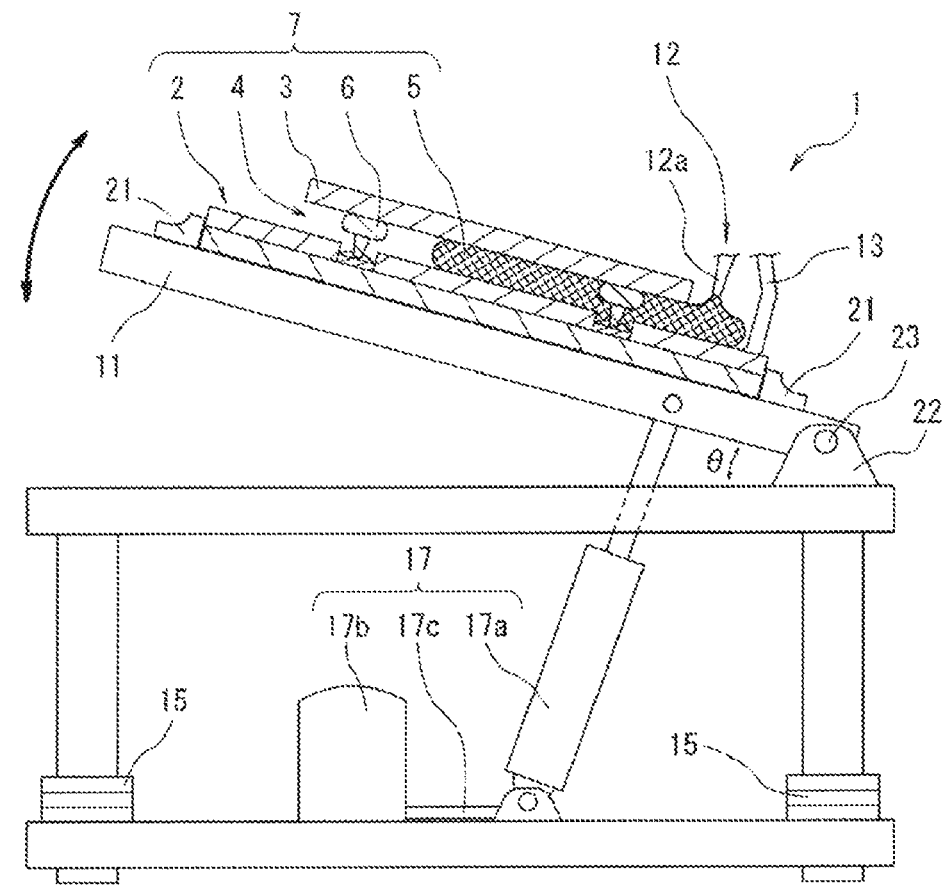
FIG. 1 is a schematic diagram showing one example of a resin filling apparatus according to an embodiment of the present invention.
Figure 2:
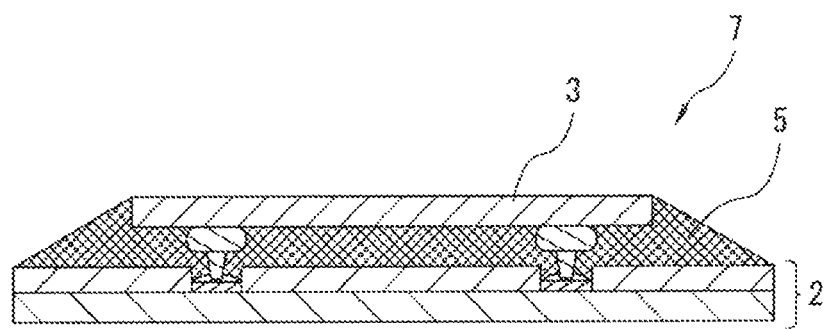
FIG. 2 is a schematic diagram showing one example of an electronic device manufactured according to a method of manufacturing an electronic device according to an embodiment of the present invention.
Figure 3:
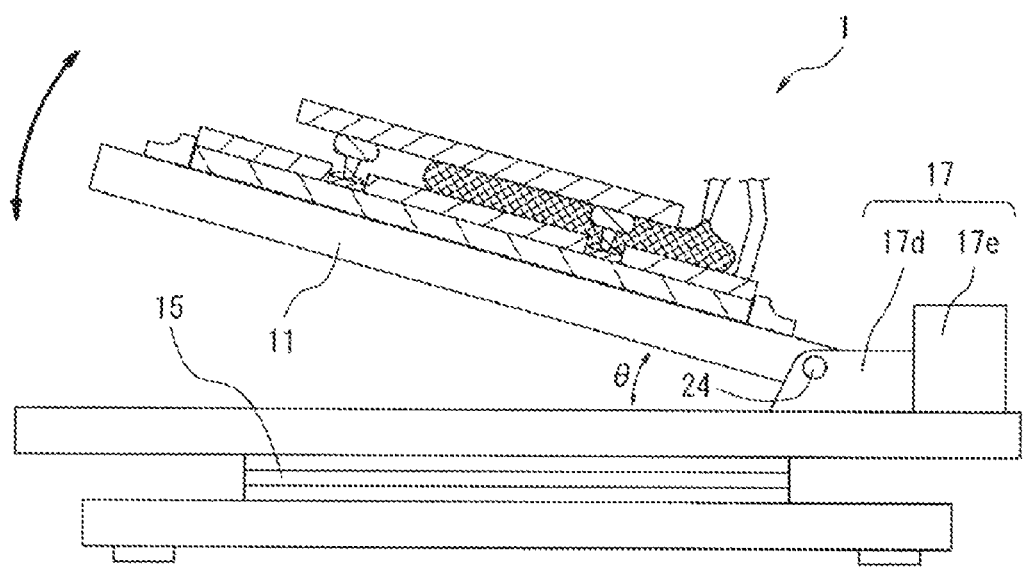
FIG. 3 is a schematic diagram showing another example of a resin filling apparatus according to an embodiment of the present invention.
Figure 4A:
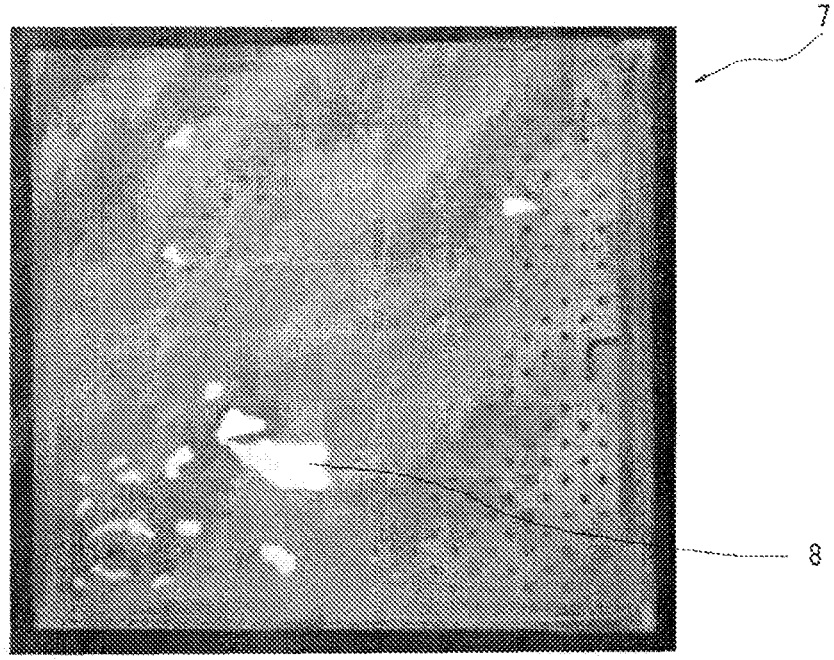
FIGS. 4A and 4B are photographs for comparing an electronic device manufactured according to a method of manufacturing an electronic device according to the present invention and an electronic device manufactured according to the conventional method of manufacturing.
Figure 4B:
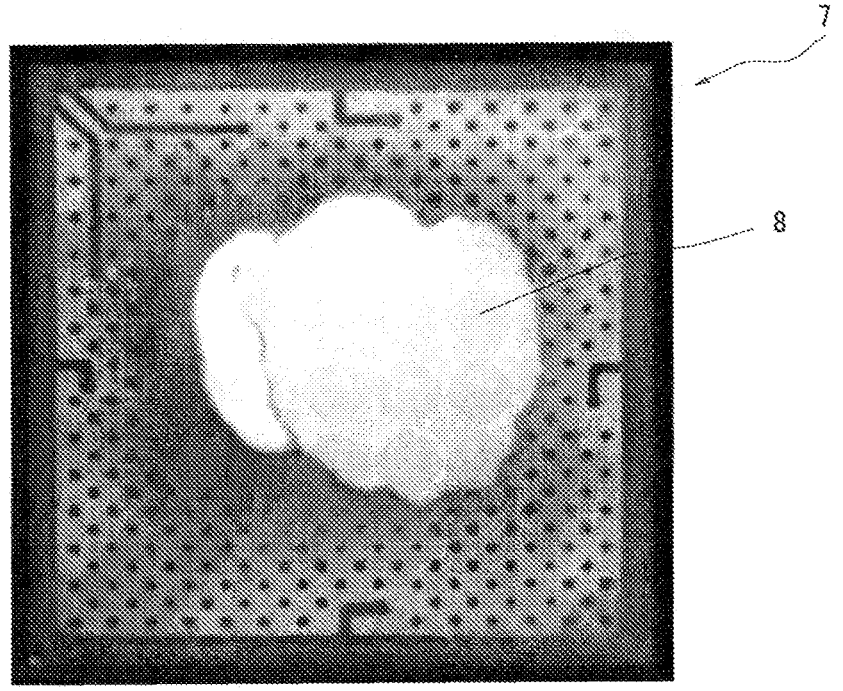
Figure 5:
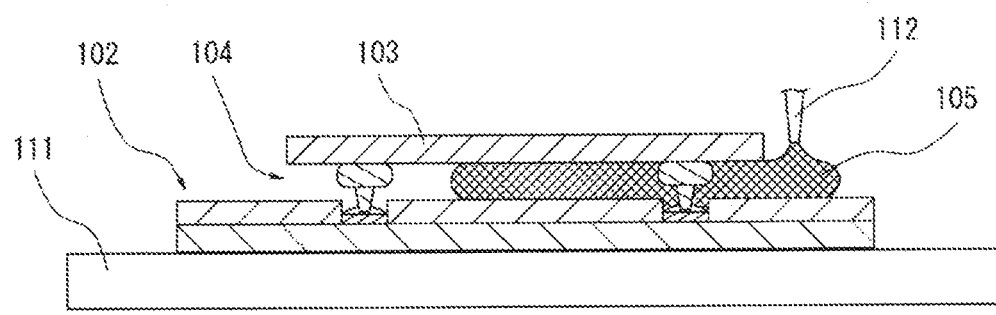
FIG. 5 is a schematic diagram useful in explaining one example of a conventional method of manufacturing an electronic device.
Figure 6:
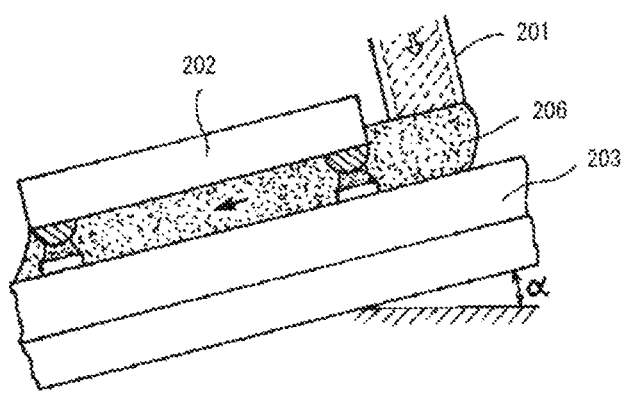
FIG. 6 is a schematic diagram useful in explaining one example of another conventional method of manufacturing an electronic device.

Embodiments of the present invention will now be described in detail with reference to the drawings. FIG. 1 is a schematic diagram showing one example of a resin filling apparatus 1 according to an embodiment of the present invention. FIG. 2 is a schematic diagram showing one example of an electronic device 7 manufactured according to a method of manufacturing an electronic device according to an embodiment of the present invention. FIG. 3 is a schematic diagram showing another example of a resin filling apparatus 1 according to an embodiment of the present invention. FIGS. 4A and 4B are photographs for comparing an electronic device 7 manufactured according to a method of manufacturing an electronic device according to the present invention and an electronic device 7 manufactured according to the conventional method of manufacturing. Note that in the present specification, the numeral 17 is a general name for the numerals 17a, 17b, . . . in the drawings (this also applies to other numerals).

The resin filling apparatus 1 is an apparatus where a cavity 4 between a substrate 2 and an electronic component 3 mounted on the substrate 2 is filled with resin 5. One example of such mounting is when the electronic component 3 (a semiconductor chip) is flip-chip bonded on the substrate 2 (a mounting substrate). Here, the distance between the substrate 2 and the electronic component 3 across the cavity 4 is around 10 to 20 μm, for example.

As shown in FIG. 1, the resin filling apparatus 1 includes a stage 11 that can support the substrate 2 in an inclined state. Note that a mechanism 21 for supporting the substrate 2 on the stage 11 may be any mechanism that can fix the substrate 2 in the inclined state, such as a clip mechanism or bolts.

The resin filling apparatus 1 includes an application head 12 that fills the cavity 4 with resin from the lower side on the incline of the substrate 2 held in the inclined state. As examples, the application head 12 is a needle, syringe, or the like, and as shown in FIG. 1, is constructed so that a front end 12a of the application head 12 can be disposed in a periphery of a lower edge of the electronic component 3 on the inclined substrate 2. Here, the expression "lower edge" used in the present specification refers to the edge positioned at the lower side on the incline of the inclined substrate 2 and the electronic component 3. On the other hand, the edge positioned at the upper side on the incline is referred to as the "upper edge". Similarly, the pair of edges that join the lower edge and the upper edge are referred to as the "side edges". Note that the expression "the periphery of the lower edge" includes the lower ends of the side edges (i.e., the ends of such side edges at the lower side on the incline).

According to the above construction, with the substrate 2 supported in the inclined state, the resin 5 can be supplied from the application head 12 to the periphery of the lower edge of the electronic component 3 on the substrate 2. When doing so, as described above, since the gap between the substrate 2 and the electronic component 3 is extremely narrow, the resin 5 will naturally fill the cavity 4 from the lower side toward the upper side on the incline due to so-called "capillary action". Note that it is also possible to use a method that fills the cavity by applying pressure to the resin instead of filling the cavity naturally.

When doing so, by filling the resin 5 from the lower side to the upper side on the incline, an effect is produced during filling whereby bubbles (voids) entrained in the resin can escape toward the upper side on the incline. Also, compared to a filling method carried out with the stage disposed flat, since gravity acts toward the lower side on the incline on the resin 5 being filled, it is possible to slow the rate at which the resin 5 fills the cavity, resulting in an effect whereby fewer voids become entrained.

Here, a flow stopping mechanism 13 can be favorably provided on the resin filling apparatus 1. Since the resin 5 is supplied onto the substrate 2 with the substrate 2 in the inclined state, depending on the material of the resin 5, the inclination angle θ, and the like, there is the risk that some of the resin 5 will flow down the incline on the substrate 2. On the other hand, by providing the flow stopping mechanism 13 at the lower end of the substrate 2, it is possible to prevent the resin 5 from flowing in this way and to keep the resin 5 in the vicinity of the lower edge of the electronic component 3. As a result, it is possible to stably continue the supplying and filling of the resin into the cavity 4 and also possible to prevent resin from adhering to unnecessary parts of the electronic device and the filling apparatus.

As shown in FIG. 1, the resin filling apparatus 1 includes an angle adjusting mechanism 17. As one example, the angle adjusting mechanism 17 includes an air cylinder 17a, a cylinder control unit 17b, and a pipe 17c. Note that as shown in FIG. 3, the angle adjusting mechanism 17 may be constructed so as to include a gear mechanism 17d and a driving control unit 17e. In either case, although the ability to support the substrate 2 (the electronic device 7) at an inclination angle θ of 0 to 90° is sufficient, depending on the construction and the like of the substrate 2, a construction that can set an angle such that θ>90° is also possible.

According to the above construction, it is possible to arbitrarily adjust the angle of the stage 11, that is, the angle of the substrate 2. As a result, it is possible to set θ at an optimal angle for the material of the resin 5.

On the other hand, even for resin of the same material, by changing the angle θ, it is possible to control the filling rate of the resin. In addition, it is also possible to change the angle θ during filling.

As shown in FIG. 1, the resin filling apparatus 1 may be constructed so that a vibrating mechanism 15 for causing the stage 11 to vibrate is provided at a support portion of the stage 11. As one example, the vibrating mechanism 15 may be an ultrasonic vibration apparatus.

According to the above construction, it is possible to apply vibration to the stage 11 during the filling of the cavity 4 with the resin 5, and as a result, it is possible to apply vibration to the substrate 2. By causing the substrate 2 to vibrate during the filling with resin, it is possible to fill the cavity 4 with no gaps and to make it easier for voids entrained in the resin to escape from the resin.

Next, a method of manufacturing the electronic device 7 according to the present invention will be described.

As one example, the electronic device 7 is a device where the electronic component 3 (a semiconductor chip) is flip-chip bonded to the substrate 2 (a mounting substrate) where the cavity 4 is filled with the resin 5 (see FIG. 2). In this method of manufacturing, as one example, the resin filling apparatus 1 shown in FIG. 1 is used to support the substrate 2, on which the electronic component 3 has been mounted, in an inclined state and to supply the resin 5 from the application head 12 or the like to the periphery of the lower edge of the electronic component 3 so as to fill the cavity 4 with the resin 5.

According to this method of manufacturing, since it is possible to fill the cavity 4 with the resin 5 from the lower side of the incline toward the upper side, there is an effect whereby it is easy for voids entrained in the resin during filling to escape from the resin up the incline. At the same time, compared to when the substrate 2 is held flat, gravity acts toward the lower side of the incline on the resin 5 during filling, so that it is possible to lower the filling rate of the resin 5, resulting in an effect of reducing the entrainment of voids.

Note that the stage 11 may be vibrated during filling with the resin 5 since this makes it easier for voids to escape from the resin.

In the method of manufacturing described above, the angle of inclination θ may be changed during filling with the resin 5. For example, a method is conceivable where at the start of filling with the resin 5, the inclination is set at a steep angle, with the inclination being changed to a gradual angle as the filling of the cavity with the resin proceeds. By doing so, it is possible to carry out precise filling control in accordance with the filled state of the resin whereby the eradication of voids is prioritized at the start of filling and once the filling has proceeded to a certain extent, a fall in the filling rate is prevented and instead the filling efficiency is prioritized.

According to the method of manufacturing described above, it is possible to manufacture an electronic device with a significant reduction in entrained voids, and as a result, it is possible to reduce the number of defective electronic devices and to keep quality high.

The effectiveness of the present invention will now be shown by comparing a micrograph of an electronic device 7 manufactured according to the method of manufacturing an electronic device according to the present invention in FIG. 4A with a micrograph of an electronic device manufactured according to the conventional method of manufacturing in FIG. 4B. As the conditions for these experiments, the electronic device shown in FIG. 4A was manufactured according to conditions where the stage temperature was 90° C., the inclination angle of the substrate θ=45, and the resin was filled from the lower edge on the incline. On the other hand, the electronic device shown in FIG. 4B was manufactured according to conditions where the stage temperature was 90° C., the inclination angle of the substrate θ=0°, and the resin was filled from one of the edges. In both micrographs, the white parts are voids 8 produced by bubble entrainment and the like during filling. As should be clear from the micrographs, there is a large reduction in voids 8 in the electronic device manufactured according to the method of manufacturing an electronic device according to the present invention. That is, the method of manufacturing according to the present invention has an extremely prominent effect of reducing voids in electronic devices manufactured using such method, so that high quality can be maintained.

Note that the method of manufacturing an electronic device described above can also be applied to filling narrow cavities with resin and provides a superior resin filling method where the entrainment of voids is prevented.

As described above, when manufacturing an electronic device where a cavity between a mounting substrate and an electronic component is filled with resin, the resin filling method, filling method, and method of manufacturing an electronic device according to the present invention can reduce the entrainment of voids when filling the resin and can make it easier for voids entrained in the resin during filling to escape upward. By doing so, it is possible to supply electronic appliances with a significantly reduced amount of entrained voids, to reduce the proportion of defective electronic devices, and to maintain high quality.

Note that although an example of an electronic apparatus connected by flip-chip bonding has been described, it should be obvious that the technical concept of the present invention can also be applied to electronic devices that are connected by wire bonding or the like.

What is claimed is:

1. A resin filling apparatus comprising:
    a stage configured to support a substrate in an inclined state, the substrate mounting an electronic component thereon;
    an application head member configured to supply resin material into a cavity between the substrate and the electronic component from a lower side of the inclined substrate;
    a flow stopping mechanism configured to prevent the resin material from flowing down the inclined substrate; and
    wherein a front end of the application head is located between the electronic component and the flow stopping mechanism, and the resin material can be supplied into the cavity from a lower side of the electronic component mounted on the inclined substrate.

2. A resin filling apparatus according to claim 1, further comprising an angle adjusting mechanism configured to arbitrarily adjust an angle of inclination at which the substrate is held on the stage.

3. A resin filling apparatus according to claim 1, further comprising a vibrating mechanism that vibrates the stage.

4. A resin filling apparatus according to claim 2, further comprising a vibrating mechanism that vibrates the stage.

* * * * *